United States Patent
Lu et al.

(10) Patent No.: US 9,484,134 B2
(45) Date of Patent: Nov. 1, 2016

(54) FEEDTHROUGH SIGNAL TRANSMISSION CIRCUIT AND METHOD UTILIZING PERMANENTLY ON BUFFER AND SWITCHABLE NORMAL BUFFER

(71) Applicant: MEDIATEK INC., Hsin-Chu (TW)

(72) Inventors: Chien-Pang Lu, Hsinchu County (TW); Yu-Tung Chang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 185 days.

(21) Appl. No.: 14/226,781

(22) Filed: Mar. 26, 2014

(65) Prior Publication Data
US 2015/0279522 A1 Oct. 1, 2015

(51) Int. Cl.
*H03K 17/687* (2006.01)
*H01B 17/26* (2006.01)

(52) U.S. Cl.
CPC ............ *H01B 17/26* (2013.01); *H03K 17/687* (2013.01)

(58) Field of Classification Search
USPC ........................................ 327/437
See application file for complete search history.

(56) References Cited

U.S. PATENT DOCUMENTS

| | | | | |
|---|---|---|---|---|
| 8,699,291 B1* | 4/2014 | Ch'ng | .................... | G11C 5/147 365/191 |
| 2010/0045327 A1* | 2/2010 | Chen | .................. | G01R 31/3277 324/750.3 |
| 2011/0148475 A1* | 6/2011 | Lin | ...................... | H03K 5/1534 327/109 |
| 2011/0273226 A1* | 11/2011 | Huang | ................. | G09G 3/3677 327/538 |
| 2012/0092323 A1* | 4/2012 | Murakami | .......... | G09G 3/3677 345/211 |
| 2012/0287712 A1* | 11/2012 | Murakami | ......... | H03K 19/0016 365/185.05 |

* cited by examiner

*Primary Examiner* — Lincoln Donovan
*Assistant Examiner* — Patrick Chen
(74) *Attorney, Agent, or Firm* — Winston Hsu; Scott Margo

(57) ABSTRACT

A feedthrough signal transmission circuit includes a first permanently on cell and a cell controlling unit. The first permanently on cell is arranged to transmit a first control signal. The cell controlling unit is coupled to the first permanently on cell, and includes a power switch and a plurality o buffers. The power switch is coupled to the first permanently on cell, arranged to receive a switch control signal and the first control signal, and selectively output the first control signal according to the switch control signal. The plurality of buffers is coupled to the power switch. Each of the buffers is arranged to buffer a data input only when powered by the first control signal output from the power switch.

10 Claims, 8 Drawing Sheets

FEEDTHROUGH SIGNAL TRANSMISSION CIRCUIT AND METHOD UTILIZING PERMANENTLY ON BUFFER AND SWITCHABLE NORMAL BUFFER

BACKGROUND

The disclosed embodiments of the present invention relate to a feedthrough signal transmission circuit and method, and more particularly, to a feedthrough signal transmission circuit and method utilizing at least one permanently on buffer and a switchable normal buffer which can be selectively powered off.

A feedthrough is a conductor used to carry a signal through a printed circuit board (PCB). Feedthroughs can be divided into power and instrumentation categories, wherein power feedthroughs are used to carry either high current or high voltage, and instrumentation feedthroughs are used to carry electrical signals which are normally low current or voltage.

Please refer to FIG. 1, which shows a feedthrough in a circuit design according to the related art. As shown in FIG. 1, the circuitry 100 comprises three circuits 10, 20, 30 belonging to different partition/block/power domains. When the circuit 20 transmits signals to the circuit 10 or receives signals from the circuit 10, those signals have to go through the circuit 30 between the circuits 10 and 20. For this reason, the circuit 30 has to be designed as a permanently on type; otherwise, the signal transmission between the circuits 10 and 20 may fail. If the circuit 30 were powered off, the circuit 20 would not be able to transmit signals to the circuit 10 or receive signals from the circuit 10. Using a permanently on cell, however, will raise the power consumption. Specifically, when a source block preceding the feedthrough circuit and a sink block following the feedthrough circuit are powered down, the feedthrough circuit will remain powered on, which inevitably results in leakage power. Therefore, there is a need for a novel feedthrough design which uses a permanently on cell but wherein the circuit can be powered off.

SUMMARY

In accordance with exemplary embodiments of the present invention, a feedthrough signal transmission circuit and method utilizing at least one permanently on buffer and a switchable normal buffer which can be selectively powered off are proposed to solve the above-mentioned problem.

According to a first aspect of the present invention, a feedthrough signal transmission circuit is disclosed. The feedthrough signal transmission circuit has a first permanently on cell and a cell controlling unit. The first permanently on cell is arranged to transmit a first control signal. The cell controlling unit is coupled to the first permanently on cell, and has a power switch and a plurality of buffers. The power switch is coupled to the first permanently on cell, and is arranged to receive the first control signal and selectively conduct a power supply signal according to the first control signal. The buffers are coupled to the power switch, wherein each of the buffers is arranged to buffer a data input only when powered by the power supply signal output from the power switch.

According to a second aspect of the present invention, a feedthrough signal transmission method is disclosed. The feedthrough signal transmission method includes: transmitting a first control signal through a first permanently on cell; and referring to the first permanently on cell to selectively provide a power supply signal to a plurality of buffers, wherein each of the buffers is arranged to buffer a data input only when powered by the power supply signal.

According to a third aspect of the present invention, a feedthrough signal transmission circuit is disclosed. The feedthrough signal transmission circuit includes a plurality of permanently on cells and a cell controlling unit. The permanently on cells are arranged to transmit a plurality of control signals, respectively. The cell controlling unit is coupled to the permanently on cells, and has a plurality of power switches and a plurality of buffers. The power switches are coupled to the permanently on cells, respectively, wherein each of the power switches is arranged to receive a corresponding control signal, and selectively conduct a power supply signal according to the corresponding control signal. The buffers are coupled to the power switches, respectively, wherein each of the buffers is arranged to buffer a data input only when powered by the power supply signal output from a corresponding power switch.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
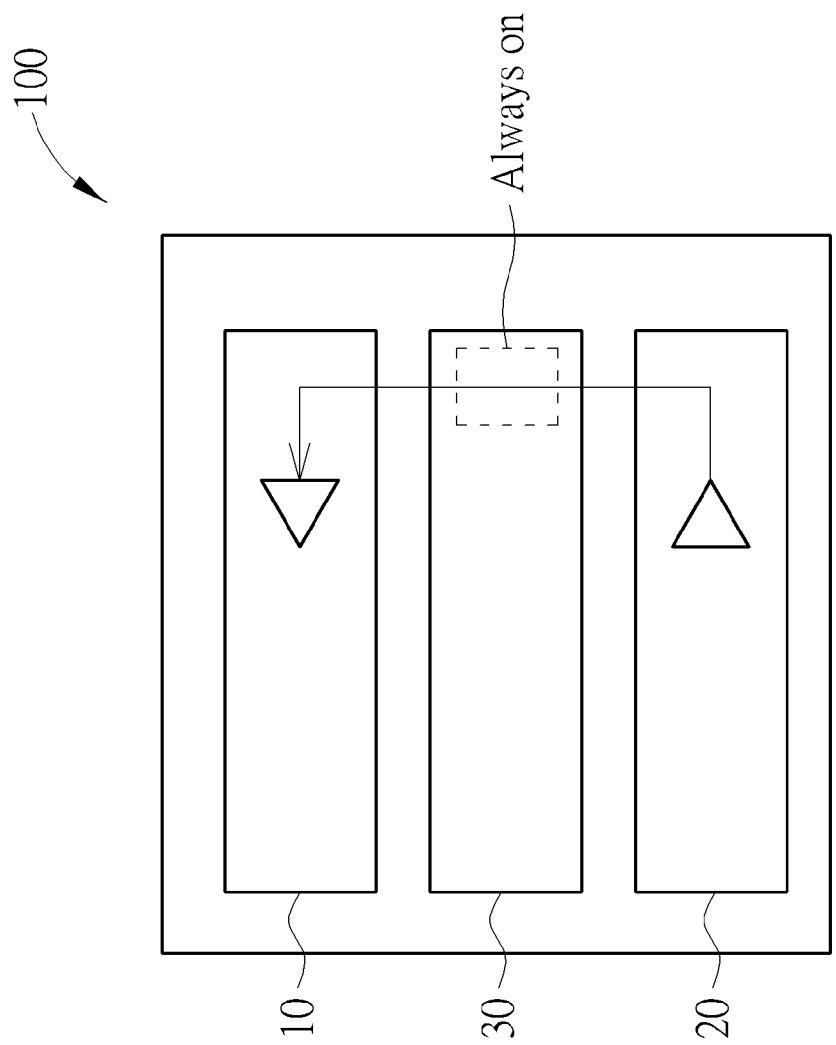
FIG. 1 shows a feedthrough in a circuit design according to the related art.
Figure 2:
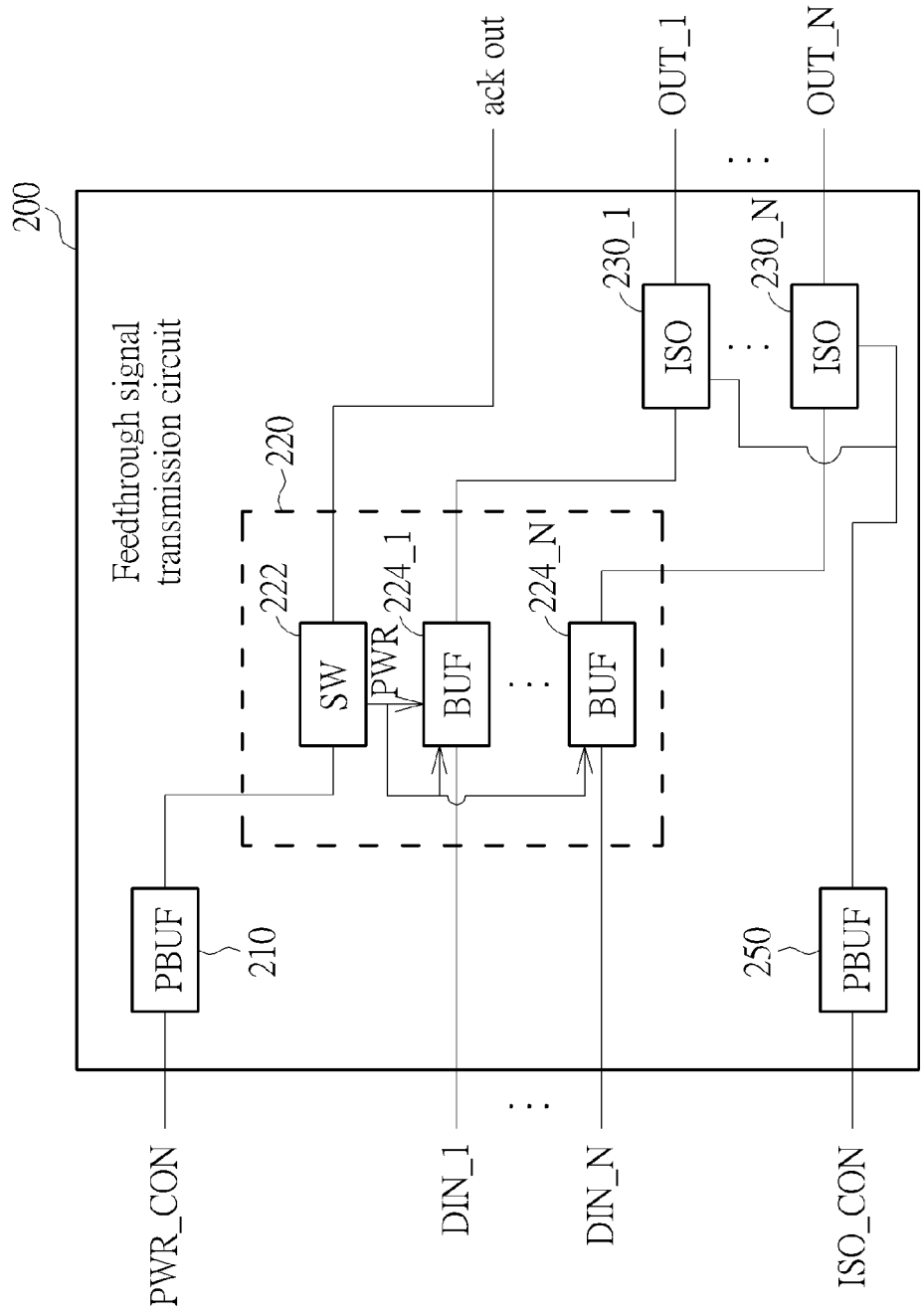
FIG. 2 shows a feedthrough signal transmission circuit according to a first embodiment of the present invention.

Please refer to FIG. 2, which shows a feedthrough signal transmission circuit 200 according to a first embodiment of the present invention. The feedthrough signal transmission circuit 200 includes a plurality of permanently on cells 210, 250 (also denoted by 'PBUF'), a cell controlling unit 220 and a plurality of repeaters 230_1-230_N (also denoted by 'ISO'). The permanently on cell 210 is arranged to receive and transmit a first control source PWR_CON. The permanently on cell 250 is arranged to receive and transmit a second control source ISO_CON. It should be noted that the permanently on cells 210 and 250 will remain active even when the power supply of other logic elements in a power domain where the feedthrough signal transmission circuit 200 is located is off. In this embodiment, none of the permanently on cells 210 and 250 is used to act as a feedthrough buffer. Instead, normal buffers are used to act as feedthrough buffers.

As shown in FIG. 2, the cell controlling unit 220 is coupled to the permanently on cell 210, and includes a power switch 222 (also denoted by 'SW') and a plurality of buffers 224_1-224_N (also denoted by 'BUF'), where the buffers 224_1-224_N are implemented using normal buffers to serve as feedthrough buffers. It should be noted that the value of N may be any positive integer, depending upon the actual design requirement/consideration. The power switch 222 is coupled to the permanently on cell 210, and receives the first control signal PWR_CON transmitted from the permanently on cell 210. The first control signal PWR_CON acts as a switch control signal. The power switch 222 refers to the first control signal PWR_CON to selectively conduct/output a power supply signal PWR. By way of example, but not limitation, the power switch 222 may be implemented using a multi-threshold complementary metal-oxide-semiconductor (MTCMOS) transistor. In this embodiment, a coarse-grained power gating topology is employed. Therefore, the voltage/logic level of the first control signal PWR_CON determines whether or not the MTCMOS transistor is conductive for providing the power supply signal PWR to the buffers 224_1-224_N. As the buffers 224_1-224_N are not permanently on buffers, each of the buffers 224_1-224_N will only buffer a corresponding data input when powered by the power supply signal PWR output from the power switch 222. For example, when powered by the power supply signal PWR, the buffers 224_1-224_N are arranged to buffer data inputs DIN_1-DIN_N and generate corresponding data outputs DIN_1-DIN_N, respectively.

In this embodiment, the output port of each of the buffers 224_1-224_N is coupled to one of the repeaters 230_1-230_N controlled by the second control signal ISO_CON transmitted from the permanently on cell 250. By way of example, the second control signal ISO_CON controls whether the repeaters 230_1-230_N are used for signal relay or used for signal isolation.

Please note that, although multiple normal buffers and multiple repeaters are illustrated in FIG. 2, the feedthrough signal transmission circuit 200 may be configured or modified to have a single normal buffer and a single repeater only.

The cell controlling unit 220 is configured in a coarse-grained fashion. A single power switch is responsible for controlling the power supply of multiple buffers. When there are data signals that need to be passed from one domain to another domain through the feedthrough signal transmission circuit 200, the first control signal PWR_CON is set to turn on the power switch 222 such that the feedthrough buffers (i.e. buffers 224_1-224_N) are powered on. Further, the second control signal ISO_CON is set to make the repeaters 230_1-230_N boost data signal strength so that data signals transmitted from buffers 224_1-224_N to a next level feedthrough signal transmission circuit will not be attenuated. When there are no data signals that need to be passed from one domain to another through the feedthrough signal transmission circuit 200, the first control signal PWR_CON is set to turn off the power switch 222 such that the feedthrough buffers (i.e. buffers 224_1-224_N) are powered down. Further, the second control signal ISO_CON may be set to make the repeaters 230_1-230_N isolate signals between two power domains. Compared to the conventional feedthrough design, the feedthrough buffers (i.e. buffers 224_1-224_N) of the proposed feedthrough design are allowed to be powered down. In this way, the leakage power consumption can be effectively mitigated and reduced.

Figure 3:
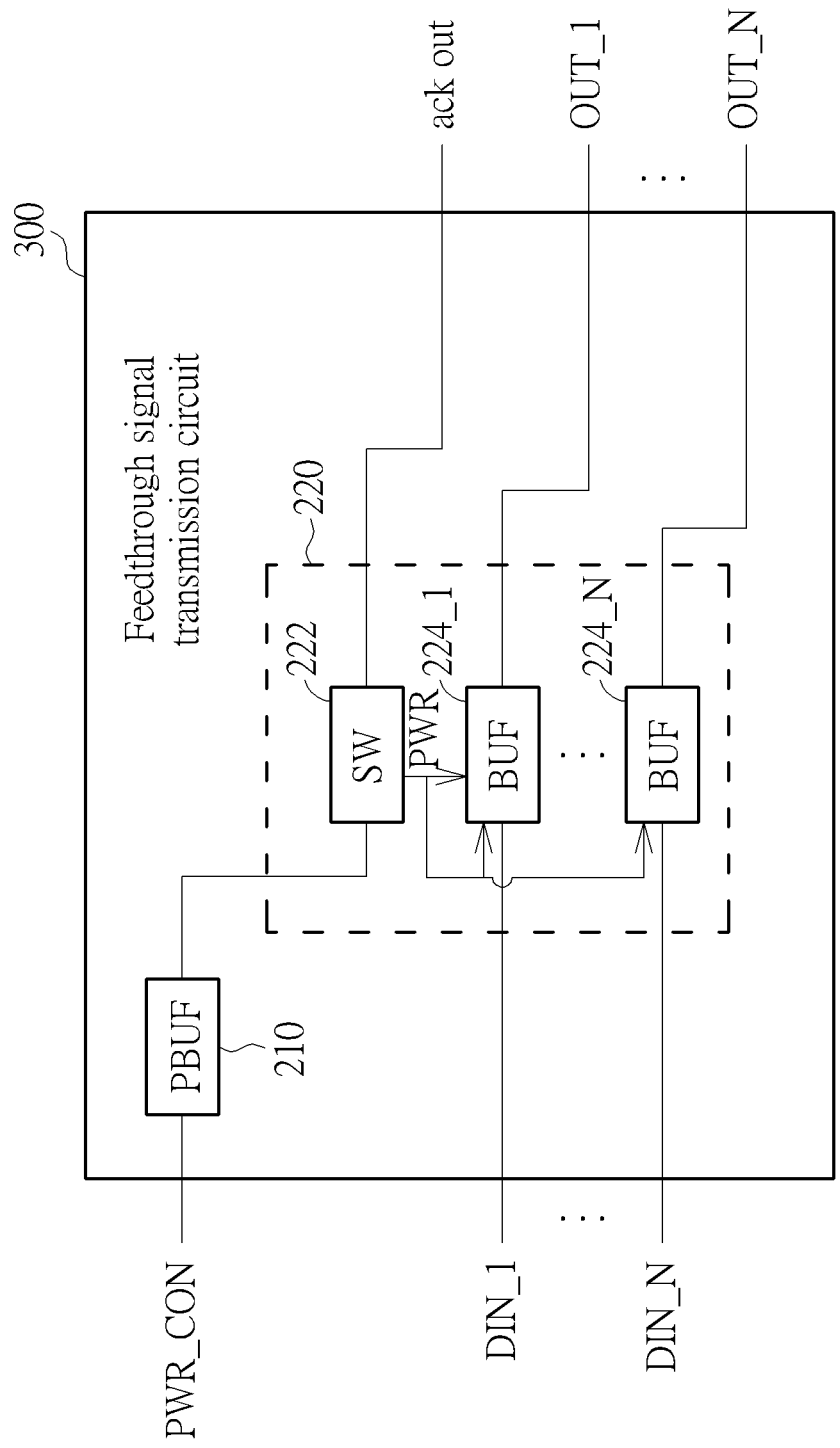
FIG. 3 shows a feedthrough signal transmission circuit according to a second embodiment of the present invention.

It should be noted that the repeaters 230_1-230_N and the permanently on cell 250 are optional elements. In an alternative design, the feedthrough signal transmission circuit 200 may be modified to omit the repeaters 230_1-230_N and the permanently on cell 250 without departing from the spirit of the present invention. FIG. 3 shows a feedthrough signal transmission circuit according to a second embodiment of the present invention. In this embodiment, the feedthrough signal transmission circuit 300 includes the aforementioned permanently on cell 210 and cell controlling unit 220, and the same objective of reducing/mitigating the leakage power consumption by powering down the feedthrough buffers is achieved.

The feedthrough signal transmission circuit 200/300 shown in FIG. 2/FIG. 3 may be used in different scenarios. Several examples are provided in the following for illustrative purposes.

Figure 4:
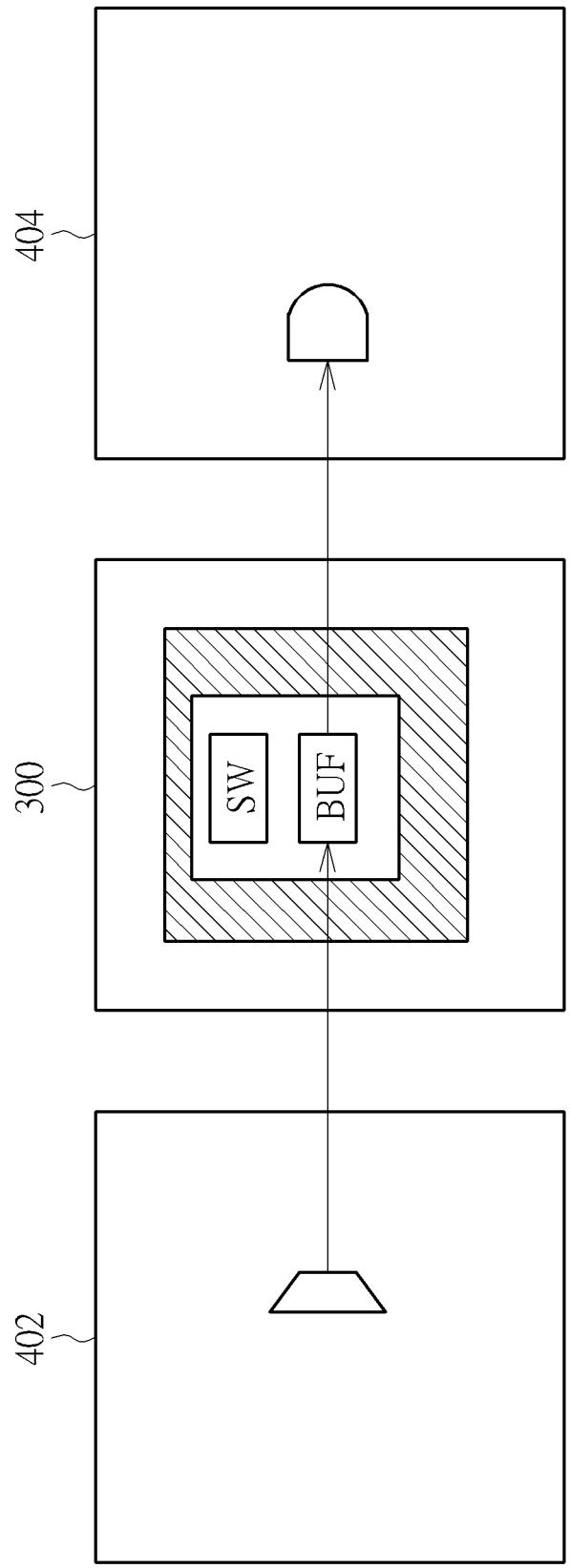
FIG. 4 shows a first exemplary scenario in which the feedthrough signal transmission circuit shown in FIG. 3 is used.

Please refer to FIG. 4, which shows a first exemplary scenario in which the feedthrough signal transmission circuit shown in FIG. 3 is used. The feedthrough signal transmission circuit 300 is coupled between two permanently on blocks 402 and 404. For clarity and simplicity, only one buffer is illustrated in the feedthrough signal transmission circuit 300. Please note that the shaded region represents an off domain, while the non-shaded region represents an on domain. In this scenario, no repeater is needed.

Figure 5:
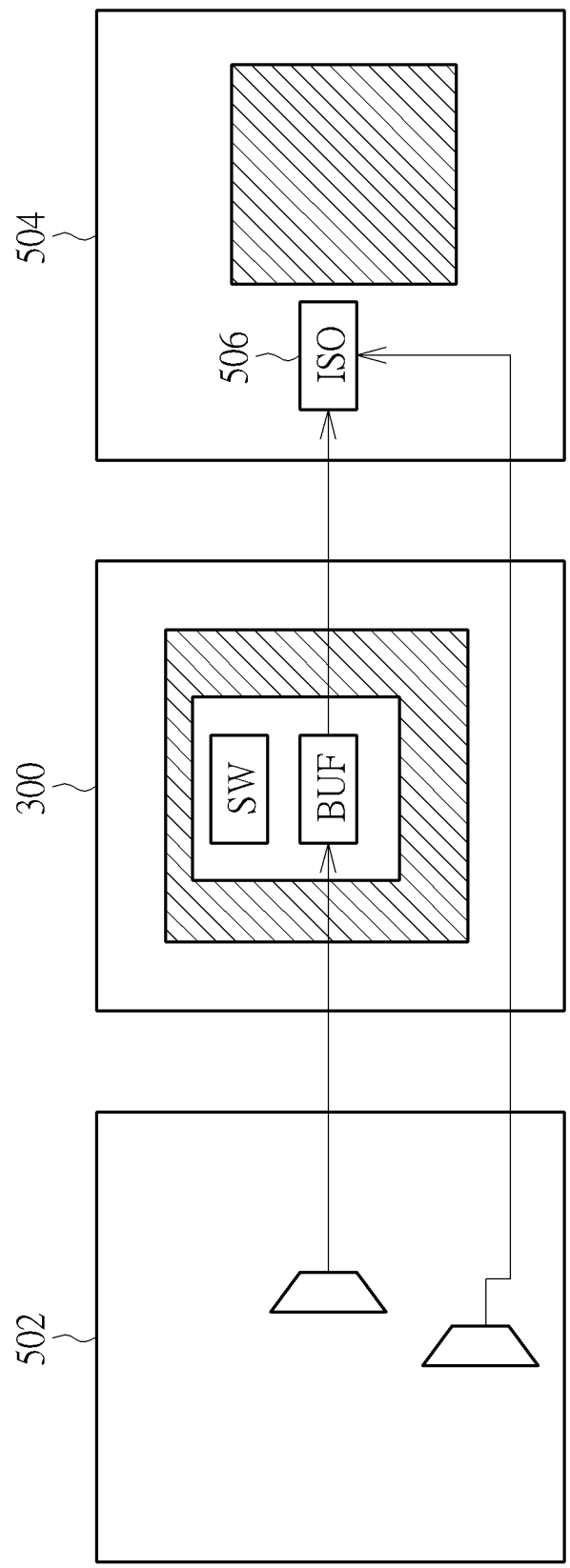
FIG. 5 shows a second exemplary scenario in which the feedthrough signal transmission circuit shown in FIG. 3 is used.

Please refer to FIG. 5, which shows a second exemplary scenario in which the feedthrough signal transmission circuit shown in FIG. 3 is used. The feedthrough signal transmission circuit 300 is coupled between a permanently on block 502 and another feedthrough signal transmission circuit 504, where the feedthrough signal transmission circuit 504 may also have the aforementioned cell controlling unit 220 implemented therein. For clarity and simplicity, only one buffer is illustrated in the feedthrough signal transmission circuit 300. Please note that the shaded region represents an off domain, while the non-shaded region represents an on domain. In this scenario, an output port of each of the buffers 224_1-224_N is coupled to a repeater 506 disposed in the feedthrough signal transmission circuit 504 following the feedthrough signal transmission circuit 300.

Figure 6:
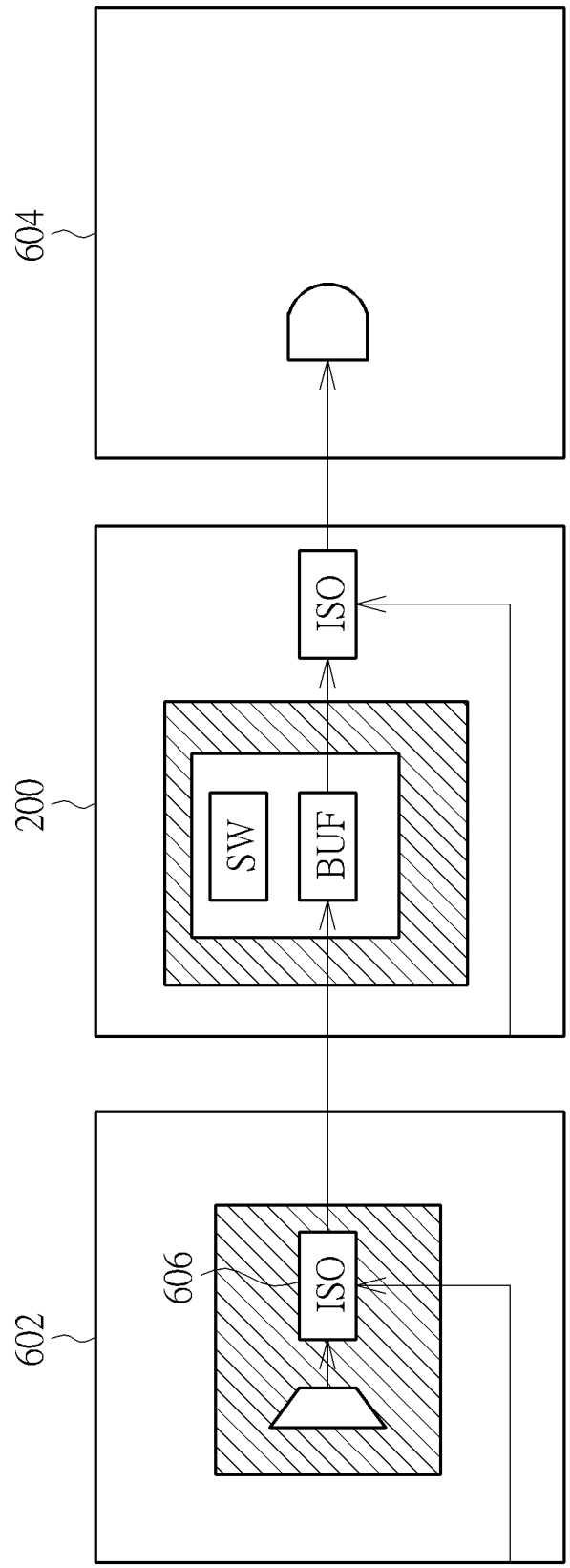
FIG. 6 shows a third exemplary scenario in which the feedthrough signal transmission circuit shown in FIG. 2 is used.

Please refer to FIG. 6, which shows a third exemplary scenario in which the feedthrough signal transmission circuit shown in FIG. 2 is used. The feedthrough signal transmission circuit 200 is coupled between another feedthrough signal transmission circuit 602 and a permanently on block 604, where the feedthrough signal transmission circuit 604 may also have the aforementioned cell controlling unit 220 implemented therein. For clarity and simplicity, only one buffer is illustrated in the feedthrough signal transmission circuit 200. Please note that the shaded region represents an off domain, while the non-shaded region represents an on domain. In this scenario, an input port of each of the buffers 224_1-224_N is coupled to a repeater 606 disposed in the feedthrough signal transmission circuit 602 preceding the feedthrough signal transmission circuit 200.

Figure 7:
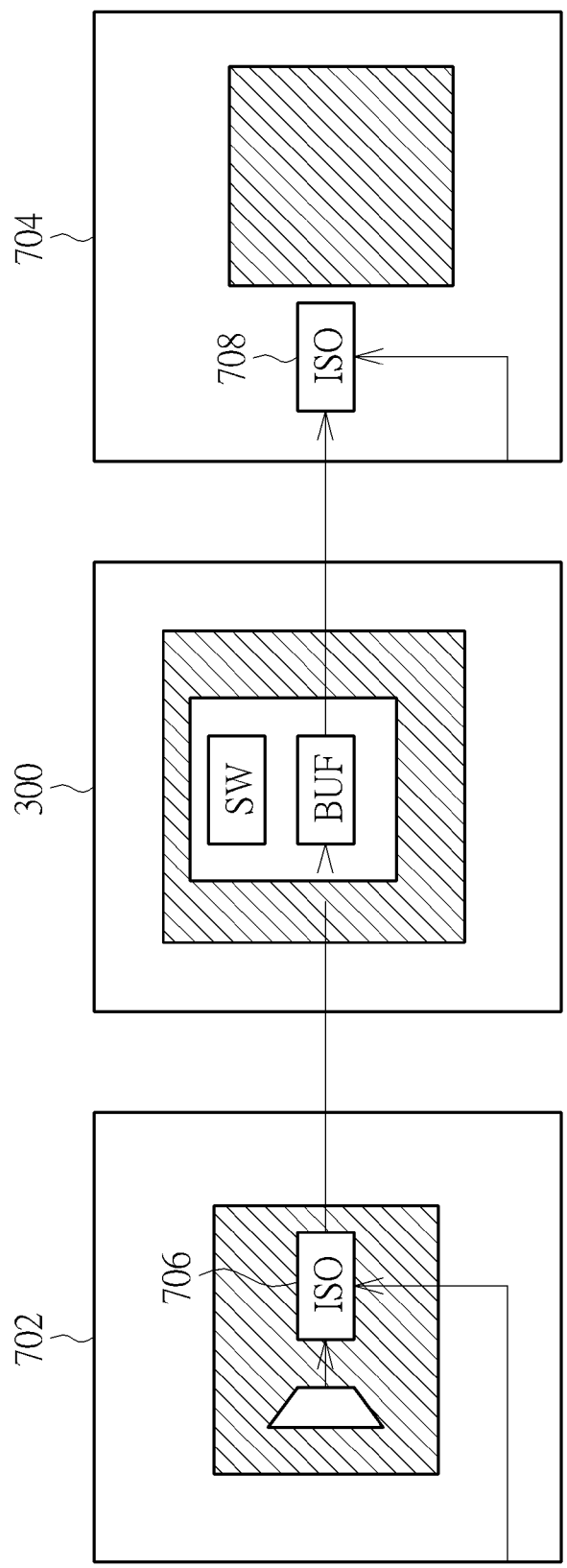
FIG. 7 shows a fourth exemplary scenario in which the feedthrough signal transmission circuit shown in FIG. 3 is used.

Please refer to FIG. 7, which shows a fourth exemplary scenario in which the feedthrough signal transmission circuit shown in FIG. 3 is used. The feedthrough signal transmission circuit 300 is coupled between two feedthrough signal transmission circuits 702 and 704, where each of the feedthrough signal transmission circuits 702 and 704 may also have the aforementioned cell controlling unit 220 implemented therein. For clarity and simplicity, only one buffer is illustrated in the feedthrough signal transmission circuit 300. Please note that the shaded region represents an off domain, while the non-shaded region represents an on domain. In this scenario, an input port of each of the buffers 224_1-224_N is coupled to a repeater 706 disposed in the feedthrough signal transmission circuit 702 preceding the feedthrough signal transmission circuit 300, and an output port of each of the buffers 224_1-224_N is coupled to a repeater 708 disposed in the feedthrough signal transmission circuit 704 following the feedthrough signal transmission circuit 300.

In each of the exemplary scenarios mentioned above, since the feedthrough buffers can be powered down under the control of the power switch according to actual needs, the power consumption of the feedthrough signal transmission circuit can be greatly reduced.

As mentioned above, a coarse-grained power gating topology is employed by the embodiments shown in FIG. 2 and FIG. 3. The same concept of the present invention may also be applied to a feedthrough signal transmission circuit with a fine-grained power gating topology. Please refer to FIG. 8, which shows a feedthrough signal transmission circuit 800 according to a third embodiment of the present invention. The feedthrough signal transmission circuit 800 includes a plurality of permanently on cells 810_1-810_N (also denoted by 'PBUF') and a cell controlling unit 820, where the cell controlling unit 820 includes a plurality of power switches 822_1-822_N (also denoted by 'SW') and a plurality of buffers 824_1-824_N (also denoted by 'BUF'). By way of example, but not limitation, each of the power switches 822_1-822_N may be implemented using a multi-threshold complementary metal-oxide-semiconductor (MTCMOS) transistor. The buffers 824_1-824_N are normal buffers which serve as feedthrough buffers. As the cell controlling unit 820 is configured in a fine-grained fashion, multiple power switches (i.e. 822_1-822_N) are controlled by multiple control signals (i.e. PWR_CON_1-PWR_CON_N transmitted by permanently on cells 810_1-810_N), respectively, and multiple power switches (i.e. 822_1-822_N) are responsible for controlling the power supply PWR of multiple buffers (i.e. 824_1-824_N), respectively. The operation and function of each of the permanently on cells 810_1-810_N are the same as that of the permanently on cell 210; the operation and function of each of the power switches 822_1-822_N are the same as that of the power switch 222; and the operation and function of each of the buffer 824_1-824_N are the same as that of each of the buffers 224_1-244_N. The operational status of each of the buffers 822_1-822_N is individually controlled by a corresponding power switch. As the feedthrough buffers implemented using normal buffers can be powered down as needed, the same objective of reducing the leakage power consumption of a feedthrough signal transmission circuit is achieved.

Figure 8:
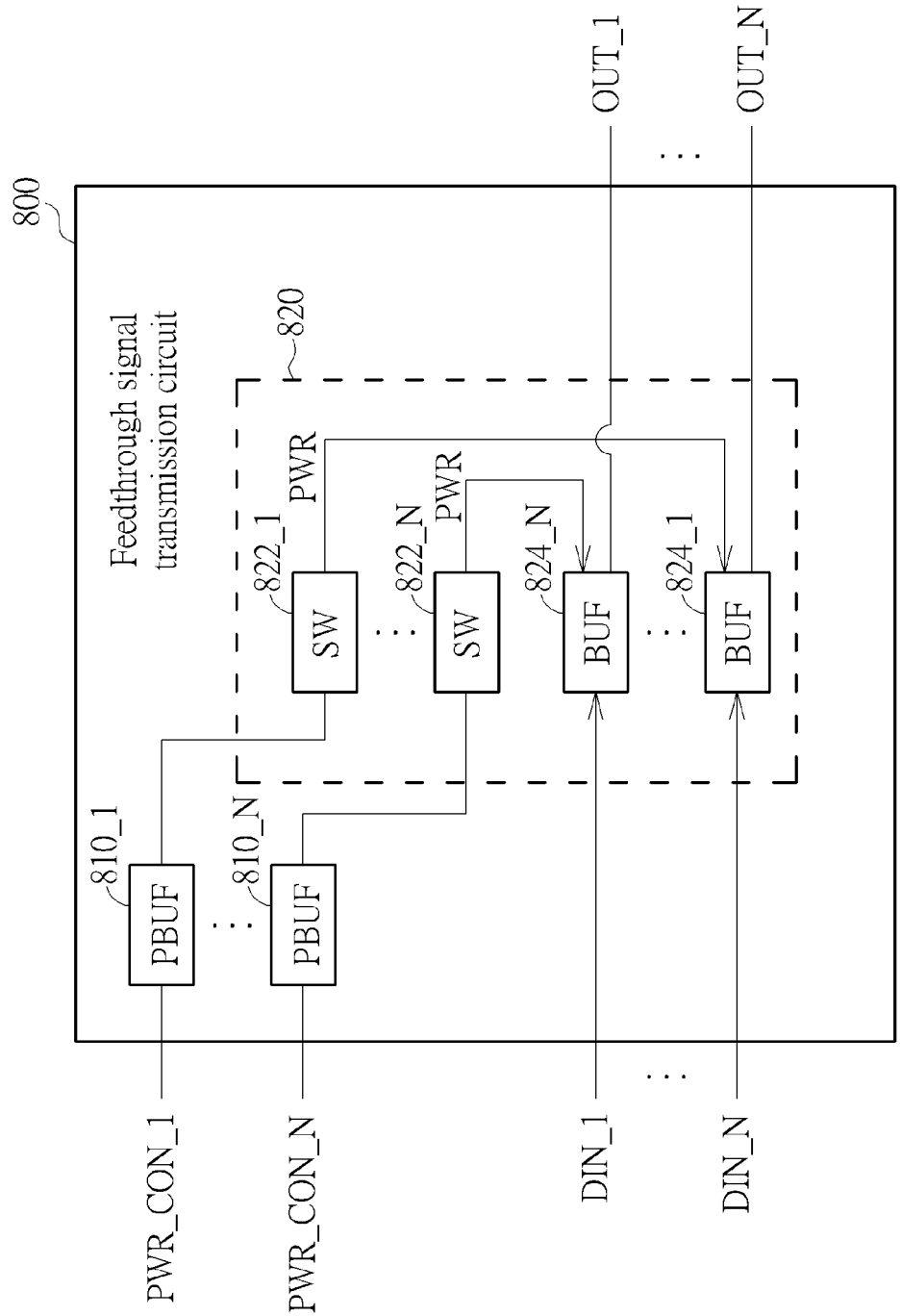
FIG. 8 shows a feedthrough signal transmission circuit according to a third embodiment of the present invention.

In the example shown in FIG. 8, no repeater is included in the feedthrough signal transmission circuit 800. This is for illustrative purposes only. In an alternative design, the feedthrough signal transmission circuit 800 may be modified to include the aforementioned repeaters 230_1-230_N shown in FIG. 2, and this also belongs to the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A feedthrough signal transmission circuit, comprising:
   a first repeater;
   a first permanently on cell, arranged to transmit a first control signal;
   a cell controlling unit, coupled to the first permanently on cell, comprising:
      a power switch, coupled to the first permanently on cell, the power switch arranged to receive the first control signal, and selectively conduct a power supply signal according to the first control signal; and
      a plurality of buffers, coupled to the power switch, wherein each of the buffers is arranged to buffer a data input only when powered by the power supply signal output from the power switch, an output of one of the buffers is not coupled to an input of another of the buffers, and an output port of each of the buffers is coupled to the first repeater; and
   a second permanently on cell, arranged to transmit a second control signal to the first repeater.

2. The feedthrough signal transmission circuit of claim 1, wherein the power switch is a multi-threshold complementary metal-oxide-semiconductor (MTCMOS) transistor.

3. The feedthrough signal transmission circuit of claim 1, wherein the feedthrough signal transmission circuit is coupled to a following feedthrough signal transmission circuit.

4. The feedthrough signal transmission circuit of claim 1, wherein an input port of each of the buffers is coupled to a second repeater.

5. The feedthrough signal transmission circuit of claim 4, wherein the feedthrough signal transmission circuit is coupled to a preceding feedthrough signal transmission circuit having the second repeater.

6. A feedthrough signal transmission method, comprising:
   transmitting a first control signal through a first permanently on cell; and
   referring to the first permanently on cell to selectively provide a power supply signal to a plurality of buffers, wherein each of the buffers is arranged to buffer a data input only when powered by the power supply signal, and an output of one of the buffers is not coupled to an input of another of the buffers;
   coupling each of the buffers to a first repeater; and
   transmitting a second control signal to the first repeater through a second permanently on cell.

7. The feedthrough signal transmission method of claim 6, wherein the step of referring to the first permanently on cell to selectively provide the power supply signal comprises:
   receiving the first control signal by a multi-threshold complementary metal-oxide-semiconductor (MTCMOS) transistor; and
   controlling the MTCMOS transistor to selectively conduct the power supply signal according to the first control signal.

8. The feedthrough signal transmission method of claim 6, wherein the step of coupling each of the buffers to the first repeater comprises:
   coupling an output port of each of the buffers to the first repeater.

9. The feedthrough signal transmission method of claim 6, further comprising:
   coupling an input port of each of the buffers to a second repeater.

10. A feedthrough signal transmission circuit, comprising:
   a first permanently on cell, arranged to transmit a first control signal; and
   a cell controlling unit, coupled to the first permanently on cell, comprising:
      a power switch, coupled to the first permanently on cell, the power switch arranged to receive the first control signal, and selectively conduct a power supply signal according to the first control signal; and
      a plurality of buffers, coupled to the power switch, wherein each of the buffers is arranged to buffer a data input only when powered by the power supply signal output from the power switch, and an output of one of the buffers is not coupled to an input of another of the buffers;
   wherein an input port of each of the buffers is coupled to a repeater, and the feedthrough signal transmission circuit is coupled to a preceding feedthrough signal transmission circuit having the repeater.

* * * * *